United States Patent
Reuter et al.

(10) Patent No.: US 12,076,854 B2
(45) Date of Patent: Sep. 3, 2024

(54) INCREASED NUMBER OF LOAD PORTS ON FACTORY INTERFACE WITH ROBOT THAT MOVES ON TRACK

(71) Applicant: Applied Materials, Inc., Santa Clara, CA (US)

(72) Inventors: Paul B. Reuter, Austin, TX (US); Sushant S. Koshti, Sunnyvale, CA (US); Maureen Frances Breiling, Campbell, CA (US)

(73) Assignee: Applied Materials, Inc., Santa Clara, CA (US)

(*) Notice: Subject to any disclaimer, the term of this patent is extended or adjusted under 35 U.S.C. 154(b) by 298 days.

(21) Appl. No.: 17/691,950

(22) Filed: Mar. 10, 2022

(65) Prior Publication Data

US 2022/0297320 A1    Sep. 22, 2022

Related U.S. Application Data

(60) Provisional application No. 63/162,998, filed on Mar. 18, 2021.

(51) Int. Cl.
| | | |
|---|---|---|
| B25J 19/00 | (2006.01) | |
| B25J 9/16 | (2006.01) | |
| B25J 21/00 | (2006.01) | |
| H01L 21/677 | (2006.01) | |

(52) U.S. Cl.
CPC ......... *B25J 19/0075* (2013.01); *B25J 9/1679* (2013.01); *B25J 9/1694* (2013.01); *B25J 21/00* (2013.01); *H01L 21/67766* (2013.01); *H01L 21/67775* (2013.01); *G05B 2219/40252* (2013.01)

(58) Field of Classification Search
CPC ...... B25J 9/0079; B25J 9/0075; B25J 9/1679; B25J 9/1694; B25J 21/00; B25J 21/005; B25J 5/02; H01L 21/67766; H01L 21/67775; H01L 21/67706; G05B 2219/40252; G05B 2219/45031
See application file for complete search history.

(56) References Cited

U.S. PATENT DOCUMENTS

| | | | | |
|---|---|---|---|---|
| 6,914,251 B1 * | 7/2005 | Weed | ................ | H01L 21/67775 414/217 |
| 10,658,217 B2 * | 5/2020 | Kawai | ............... | H01L 21/67253 |

(Continued)

FOREIGN PATENT DOCUMENTS

| | | |
|---|---|---|
| JP | 10067429 A | 3/1998 |
| JP | 2018174259 A | 11/2018 |
| JP | 2019161117 A | 9/2019 |

OTHER PUBLICATIONS

International Search Report and Written Opinion for International application No. PCT/US2022/020793, mailed Jul. 4, 2022, 11 pages.

*Primary Examiner* — Glenn F Myers
(74) *Attorney, Agent, or Firm* — Lowenstein Sandler LLP

(57) ABSTRACT

A factory interface includes a housing, a front surface of the housing having multiple load ports, a robot having an arm and an end effector, and a track attached to a floor within the housing. The robot is adapted to move horizontally along the track to multiple positions from which the arm can reach the end effector of the robot into a front opening unified pod attached to any of the multiple load ports.

20 Claims, 12 Drawing Sheets

(56) References Cited

U.S. PATENT DOCUMENTS

2001/0041129 A1* 11/2001 Tsuneda ............ H01L 21/67796
                                                            414/744.1
2003/0044261 A1     3/2003 Bonora et al.
2019/0326134 A1* 10/2019 Suzuki .............. H01L 21/67775

* cited by examiner

INCREASED NUMBER OF LOAD PORTS ON FACTORY INTERFACE WITH ROBOT THAT MOVES ON TRACK

RELATED APPLICATIONS

The present application claims priority to U.S. Provisional Patent Application No. 63/162,998 filed Mar. 18, 2021, and entitled "INCREASED NUMBER OF LOAD PORTS ON FACTORY INTERFACE WITH ROBOT THAT MOVES ON TRACK," which is herein incorporated by this reference in its entirety.

TECHNICAL FIELD

Embodiments of the present disclosure relate to an increased number of load ports on a factory interface with a robot that moves on a track.

BACKGROUND

Electronic device manufacturing systems may include multiple process chambers arranged around a mainframe housing having a transfer chamber and one or more load lock chambers configured to pass substrates into the transfer chamber. These systems may employ a transfer robot, which may be housed in the transfer chamber, for example. The transfer robot may be a selectively compliant articulated robot arm (SCARA) robot or the like, and may be adapted to transport substrates between the various processing chambers and one or more load lock chambers. For example, the transfer robot may transport substrates from process chamber to process chamber, from load lock chamber to process chamber, and vice versa.

Processing of substrates in semi-conductor component manufacturing is generally carried out in multiple tools, where the substrates travel between the tools in substrate carriers (e.g., front opening unified pods or FOUPs). The FOUPs may be docked to an EFEM (sometimes referred to as a "factory interface or FI"), which includes a load/unload (or FI) robot therein that is operable to transfer substrates between the FOUPs and the one or more load locks of the tool, therefore allowing substrates to pass through for processing in the processing chambers. The load lock can provide a clean environmental buffer for substrates before the substrates are transferred into the transfer chamber that typically includes a pressurized vacuum environment. Designs of electronic device manufacturing systems generally endeavor to reduce the contaminants to which the substrates are exposed.

SUMMARY

Some of the embodiments described herein cover a factory interface including a housing, a front surface of the housing having multiple load ports, a robot having an arm and an end effector, and a track attached to a floor within the housing. The robot is adapted to move horizontally along the track to multiple positions from which the arm can reach the end effector of the robot into a front opening unified pod attached to any of the multiple load ports.

Other embodiments described herein cover an assembly including a robot having an arm and an end effector. The assembly further includes a track attachable to a floor within a factory interface, where the robot is slidably attachable to the track to move horizontally along the track to multiple positions from which the arm can reach the end effector of the robot into a front opening unified pod attached to any of a plurality of load ports of the factory interface. The assembly further includes a ball screw assembly having a ball screw shaft coupled to a motor via a timing belt and a nut operatively coupled between the ball screw shaft and the robot. The ball screw assembly is to move the robot horizontally along the track.

At least some embodiments described herein cover a method of operating an assembly having a robot that is slidably attached to a track, the track being attached to a floor of a factory interface. The method can include receiving a command identifying, as a destination, a front opening unified pod (FOUP) attached to a first load port of multiple load ports of the factory interface. The method can further include causing the robot to move horizontally along the track to a position of multiple positions from which an arm of the robot is to reach, into the FOUP, an end effector that is attached to the arm. The method can further include causing the arm of the robot to reach the end effector into the FOUP through the first load port. The method can further include causing the arm of the robot to one of pick or place a substrate from or to the FOUP.

Numerous other features are provided in accordance with these and other embodiments of the disclosure. Other features and embodiments of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the FIGURES of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to systems and methods for an increased number of load ports on a factory interface with a robot that moves on a track. For example, existing systems can benefit from increased efficiency and throughput and/or process quality improvements within the factory interface ("FI"). Increase in quality can refer to transference of substrates between the FI and the load lock without the introduction of an unacceptable number of containments, e.g., particles, airborne molecular contaminants (AMCs), and/or volatile organic compounds (VOCs) present in the factory interface or that come in through gas intakes from a fabrication facility. In some embodiments, a factory interface and corresponding assembly are described that add one to two additional load ports to have a total of at least six load ports, although more than six load ports is envisioned. Due to the increased length such that the factory interface accommodates the at least six load ports, an FI robot can be adapted to move along a track in order to extend a reach of arms of the FI robot to the farthest load port positions from the FI robot.

Use of the FI robot itself introduces moving parts and the potential for contamination. Adding movement of the FI robot along a track increases the number of moving parts, lubricants, and potential exposure to contaminants. Accordingly, various structures and modifications to the factory interface can be employed to remove such containments at the level of the track and the FI robot before the contaminants can rise (or circulate) to the level of the substrates (e.g., silicon wafers) being transferred by an end effector of the robot and before the contaminants escape into a front opening unified pod (FOUP) or load lock, for example. Because the disclosed FI employs gas recirculation, the elimination of containments is made more complicated than simply sucking the gas out of bottom or side vents, for example.

Therefore, advantages of the systems and methods implemented in accordance with some embodiments of the present disclosure include, but are not limited to, designing a factory interface with additional load ports, and thus increased substrate throughput and/or storage capacity, while also reducing the contaminants generated by a robot that moves along a track. Other advantages will be apparent to those skilled in the art of factory interface hardware and control design will be discussed hereinafter.

Figure 1A:
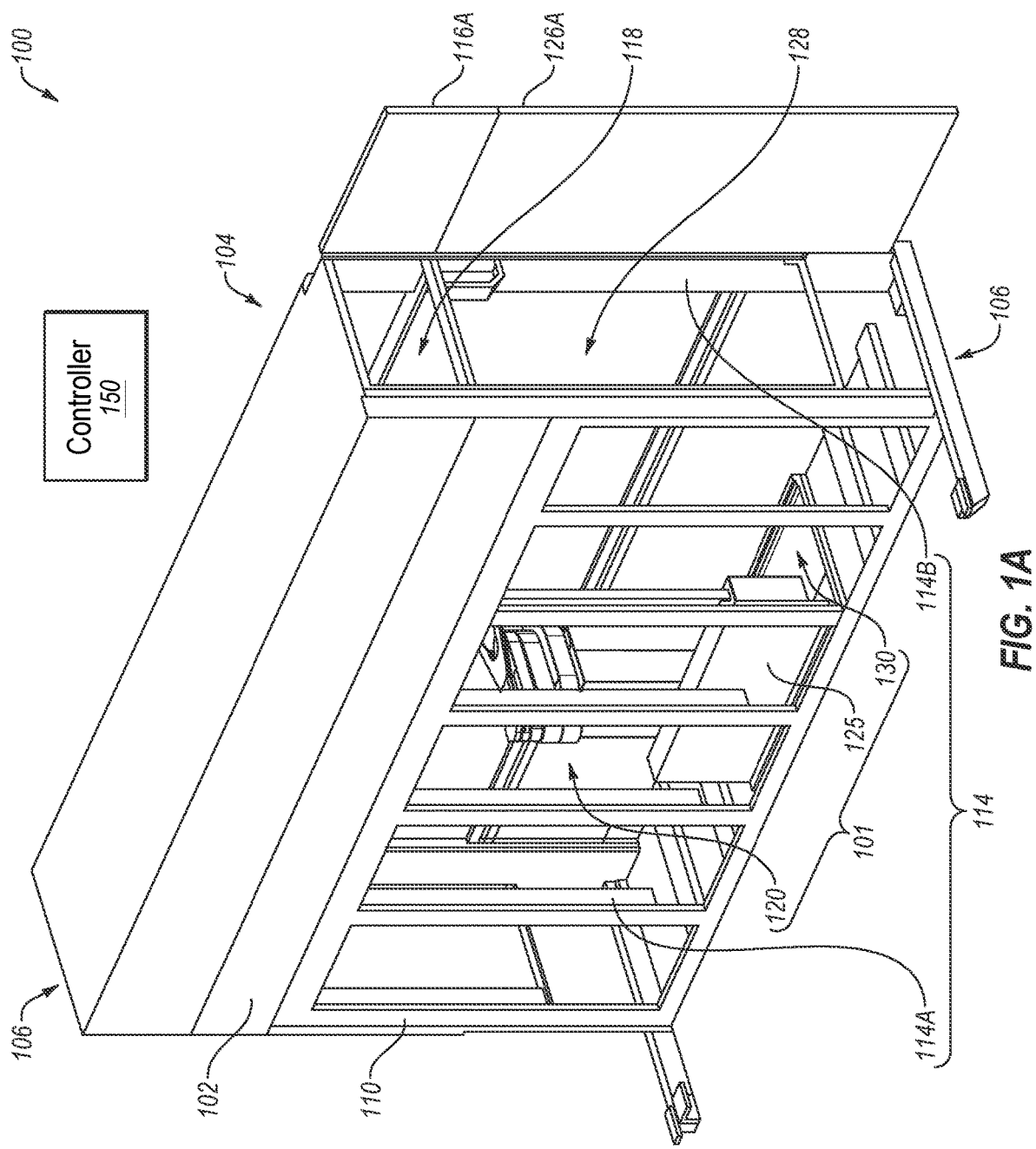
FIG. 1A is a perspective view of an example factory interface (FI) according to various embodiments.
Figure 1B:
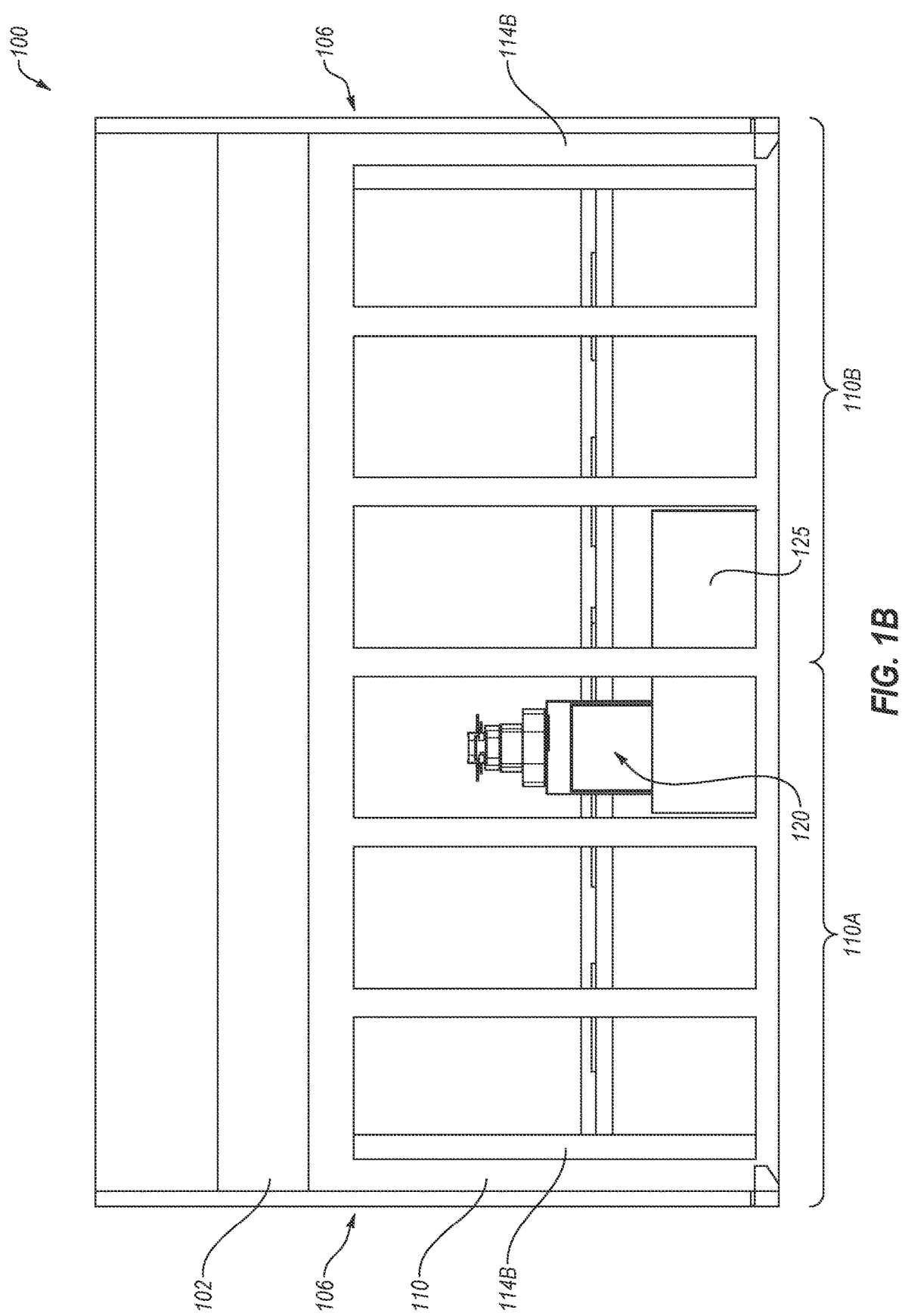
FIG. 1B is a front view of the factory interface of FIG. 1A according to various embodiments.
Figure 1C:
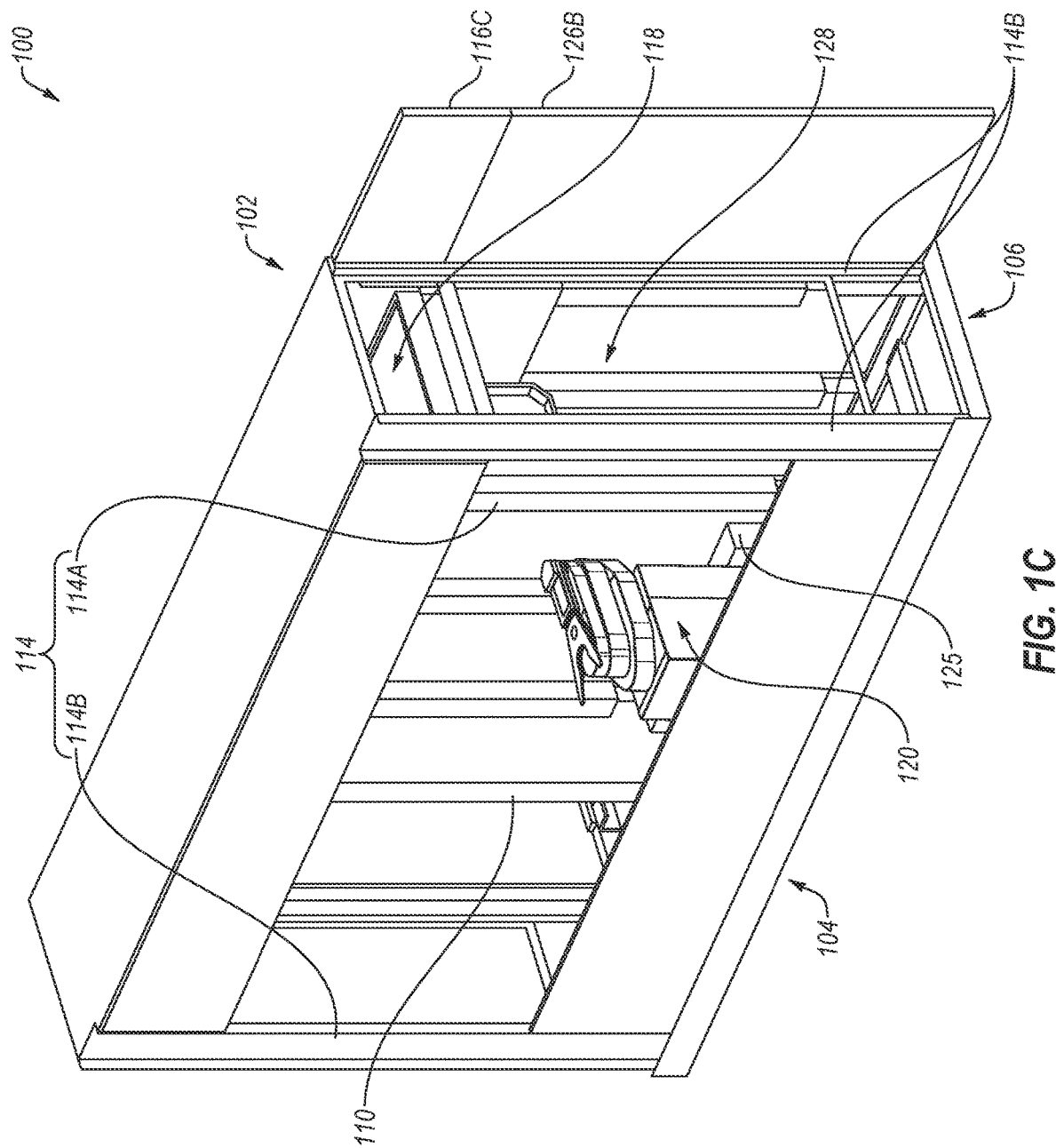
FIG. 1C is another perspective view of the example factory interface according to various embodiments.

FIG. 1A is a perspective view of an example factory interface 100 according to various embodiments. FIG. 1B is a front view of the factory interface of FIG. 1A according to various embodiments. FIG. 1C is another perspective view of the example factory interface 100 according to various embodiments. In these embodiments, the factory interface 100 (or FI 100) includes a housing having a front 102 (or front surface), a back 104 (or back surface), and sides 106 (or side surfaces). The front 102 of the FI 100 housing can be configured with a set of load ports 110. In some embodiments, the set of load ports 110 include at least six load ports, three load ports 110A to the left and three load ports 110B to the right along a length of the FI 100. As discussed, however, in other embodiments, the set of load ports 110 is increased, e.g., to include four load ports on each of the right and left to a total of eight load ports or more. A FOUP, a side storage pod (SSP), or other substrate container can be attached to any of the set of load ports 110 from which substrates are withdrawn and/or to which substrates are delivered.

In at least some embodiments, the factory interface 100 includes an FI robot assembly 101 that includes an FI robot 120 and a track 130 on which the FI robot 120 is slidably attached. In these embodiments, the track 130 is attached (or mounted) to the bottom of the factory interface 100. In different embodiments, the bottom of the factory interface 100 is either a bottom frame piece of the FI housing or a floor (e.g., factory floor) of the factory interface 100 in the case the factory interface 100 has no bottom frame piece. In these embodiments, the FI robot 120 is slidably attached and moves horizontally along the track 130 to multiple positions from which an arm of the robot 120 can reach an end effector, which is attached to the arm, into a FOUP (or SSP or other substrate container) attached to any of the set of load ports 110. The track 130 can include one or more rails or guides to confine the linear movement of the FI robot 120 back and forth, as will be discussed in detail.

As illustrated, in some embodiments, the track 130 extends along a subset of the set of load ports 110 that excludes at least the outermost load ports of the set of load ports 110. Thus, the track 130 enables the FI robot 120 to move horizontally back and forth generally between being positioned at any of the middle load ports of the set of load ports 110. For example, the robot 120 can move along the track 130 until being located at a position of multiple positions from which an arm of the robot 120 can reach the end effector of the robot 120 into a FOUP attached to any of the set of load ports 110. These multiple positions can exclude at least the outermost two load ports of the set of load ports 110. In this way, when the FI robot 120 is at the left-most position (as illustrated in FIGS. 1A-1C), an arm and end effector of the FI robot 120 can reach into each of the left three load ports 110A. Similarly, when the FI robot 120 is at the right-most position, the arm and end effector of the FI robot 120 can reach into each of the right three load ports 110B.

These embodiments can be extended to additional load ports, such as four load ports on the left of center and four load ports on the right of center, or more. By making the track 130 shorter and generally confined to the middle load ports, these embodiments minimize the track length and thus also minimize contaminants the track 130 is expected generate. In other embodiments, the track 130 is made longer than illustrated, e.g., extending along the middle four load ports, in order to reach additional load ports positions for six, seven, or more load ports.

In various embodiments, the FI 100 includes a gas recirculation system, including a pressurized plenum 118 (or plenum 118 for simplicity) at a top area of the FI 100 housing. This pressurized plenum 118 can include fans (or other source of forced gas) that initiate and drive gas flow of the gas recirculation system, including to force gas downward through the housing and pull the gas back up through the FI 100 to the pressurized plenum 118. By recirculating the gas within the housing, the FI 100 avoids the intake of the gas on a continuous basis from the fab environment outside of the FI 100. But, the gas recirculation system also increases the risk of circulating contaminants from the FI robot 120 and the track 130, particularly from moving parts, back down onto the substrates that are being passed through the FI 100 by the FI robot 120.

Figure 2A:
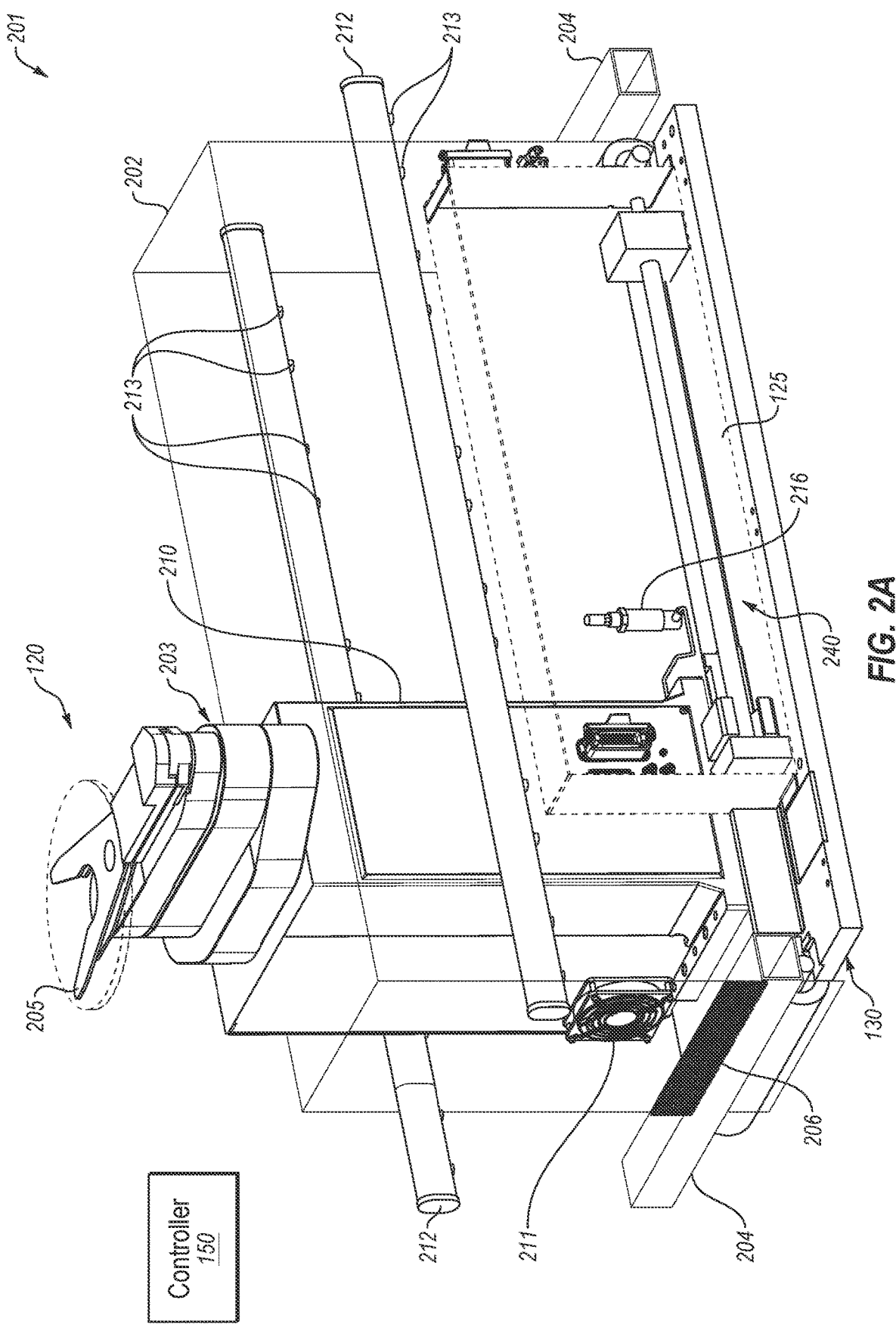
FIG. 2A is a perspective view of the FI robot assembly having an FI robot that moves horizontally on a track according to an embodiment.
Figure 2B:
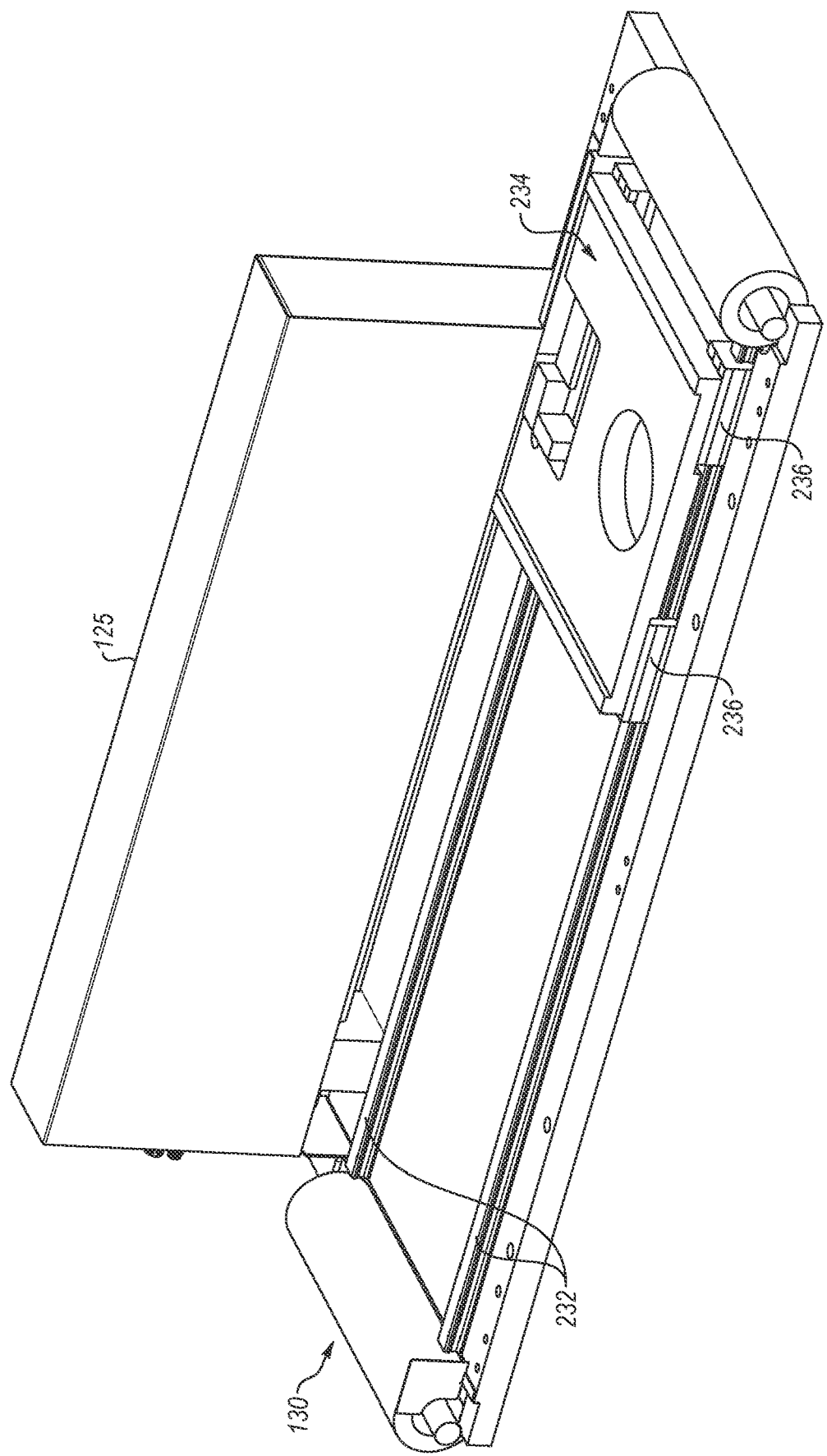
FIG. 2B is a perspective view of the track and driving box of the FI robot assembly of FIG. 2A according to an embodiment.
Figure 3:
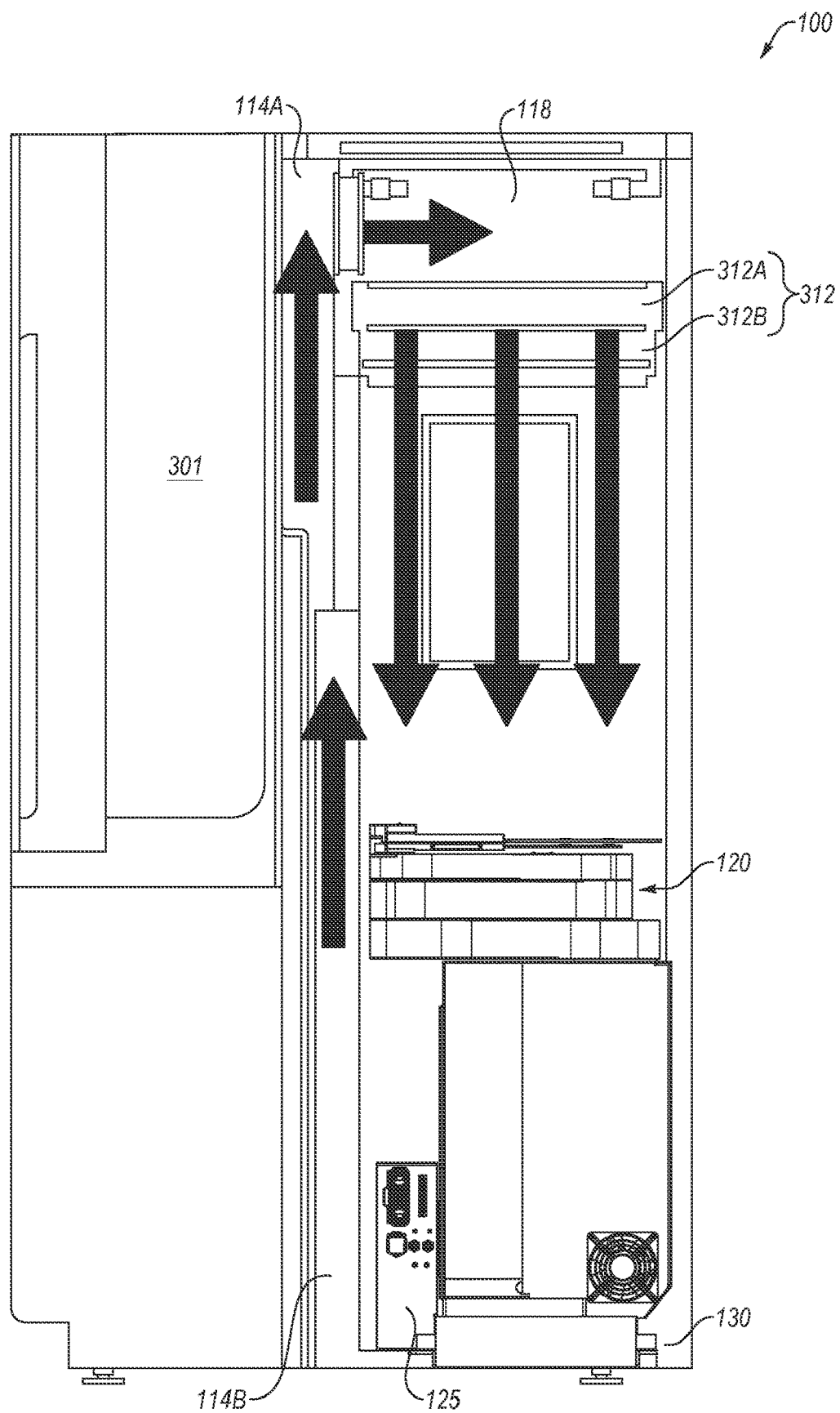
FIG. 3 is a side view of the factory interface mated with a front opening unified pod (FOUP) at a load port, illustrating general gas flow according to an embodiment.

In some embodiments, the gas recirculation system can force gas in the form of ambient air, clean dry air (CDA), nitrogen, or other inert gas, downward from the plenum 118, through the height of the FI 100, and to recirculate the gas back up to the pressurized plenum 118 through a set of return ducts 114 (see also FIG. 3). The set of return ducts 114, for example, can include a return duct 114A on the inside of the factory interface 100 as part of or next to the framing between each load port 110. The set of return ducts 114 can further include a return duct 114B at each inside corner along a height of the housing of the FI 100. Thus, this set of return ducts 114 generally runs top to bottom and the fan and gas circulation ultimately forces return gas back through the return ducts 114. The plenum 118 can also include a multilayer filter to filter out chemicals, organics, and particles, and which will be discussed in more detail with reference to FIG. 3. In various embodiments, the FI 100 includes a driving box 125 surrounding the track 130 and the FI robot 120, where at least a part of the driving box 125 is part of or integrated with a track plenum, which will be discussed in detail with reference to FIG. 2A.

In at least some embodiments, the factory interface 100 further includes a first door 116A attached to a first side of the housing to selectively cover the pressurized plenum 118, and a second door 126A attached to the first side of the housing to selectively cover a space 128 occupied by the robot 120 and the track 130. In at least some embodiments, the factory interface 100 further includes a third door 116B attached to a second side of the housing to selectively cover the pressurized plenum 118, and a fourth door 126B attached to the second side of the housing to selectively cover a space 128 occupied by the robot 120 and the track 130. Allowing the second door 126A and the fourth door 126B to be selectively (e.g., independently) opened while the first door 116A and the third door 116B are kept closed, can allow access (e.g., for maintenance of repair) to the moving parts (e.g., the robot 120, the track 130, and associated components) while the pressurized plenum is kept free from moisture and contaminants. Further, the gas recirculation can continue to function to continue to filter out particles during maintenance or repair.

In illustrated embodiments, the FI 100 further includes a controller 150 (FIG. IA), which can be coupled with the FI robot 120, with mechanics associated with the track 130 (e.g., that direct the horizontal motion), and with different aspects of the gas recirculation system. Signals from the controller 150 can cause motion of the various components of the FI robot 120 and/or adjustments in the gas recirculation system. Suitable feedback mechanisms can be provided for one or more of the components by various sensors, such as position encoders, gas contaminant sensors, and the like, and can also react to user inputs. The controller 150 can include suitable processor, memory, and electronic components for receiving inputs from the various sensors and for controlling one or more valves, actuators, vents, and the like to control the environmental conditions within a mini-environment of the FI 100 in which the FI robot 120 operates, as will be expanded on below.

Figure 1D:
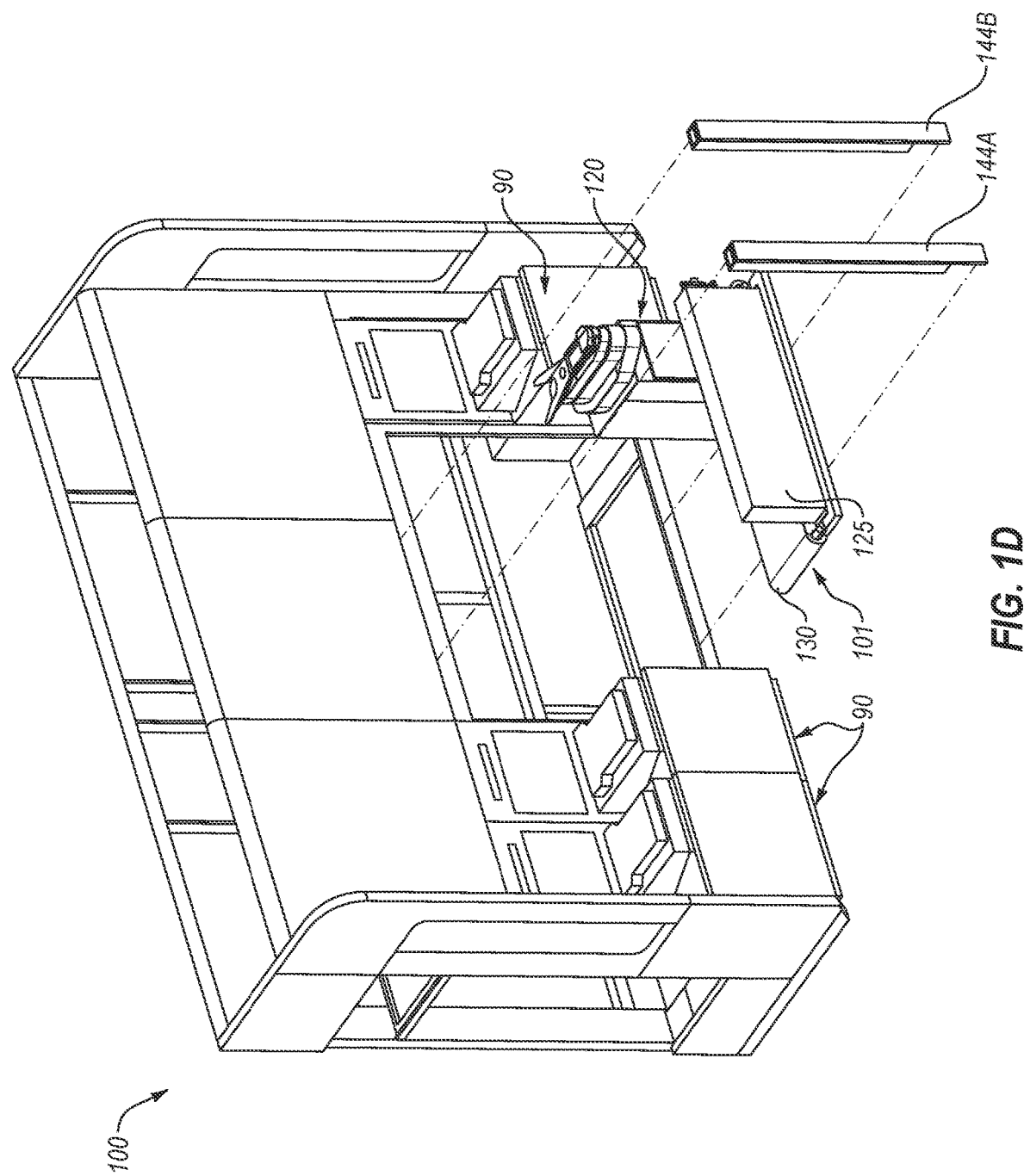
FIG. 1D is perspective view of the factory interface in which two middle posts are removable as is an FI robot assembly, as disclosed herein, according to an embodiment.

FIG. 1D is perspective view of the factory interface 100 in which two middle posts 144A and 144B are removable as is the FI robot assembly 101, as disclosed herein, according to an embodiment. The factory interface 100, as was discussed, may further include a FOUP 90 (or SSP or the like) attached to each load port of the set of load ports 110. In at least some embodiments, the two middle posts 144A and 144B (or other set of posts that define at least some of the load ports of the set of load ports 110) are removable. Further, the FI robot assembly 101, which includes at least the robot 120 and the driving box 125, is also removable (e.g., by sliding out and/or being lifted out by a crane) once the two middle posts 144A and 144B have been removed. The removability of the FI robot assembly 101 may facilitate cleaning and maintenance or replacement associated with the FI robot assembly 101.

FIG. 2A is a perspective view of an FI robot assembly 201 having the FI robot 120 that moves horizontally on the track 130 according to an embodiment. The components of the FI robot assembly 201 can be assembled into an already existing factory interface 100 in some situations. In various embodiments, the FI robot assembly 201 includes the FI robot 120, the driving box 125, the track 130, a track plenum 202, and one or more gas lines 212. The FI robot 120 can include a motor assembly 210, an arm assembly 203 (or "arm" for simplicity), and an end effector 205. The motor assembly 210 can control the arm assembly 203 to perform reach and pick and reach and drop operations with the end effector 205 in order to move substrates from one location to another, e.g., from a FOUP (e.g., the FOUP 90) to a load lock, or from a load lock to a FOUP or a side storage pod.

The FI robot 120 can further include one or more fans 211 built into the motor assembly 201 to keep the moving parts of the motor assembly 201 cool, where the one or more fans 211 themselves can emit some contaminants. Thus, in some embodiments, the one or more fans 211 include a chemical and particle filter at an outlet of the one or more fans 211 to provide some localized filtration of contaminants that are created locally to the track plenum 202 and/or by the one or more fans 211.

Figure 2C:
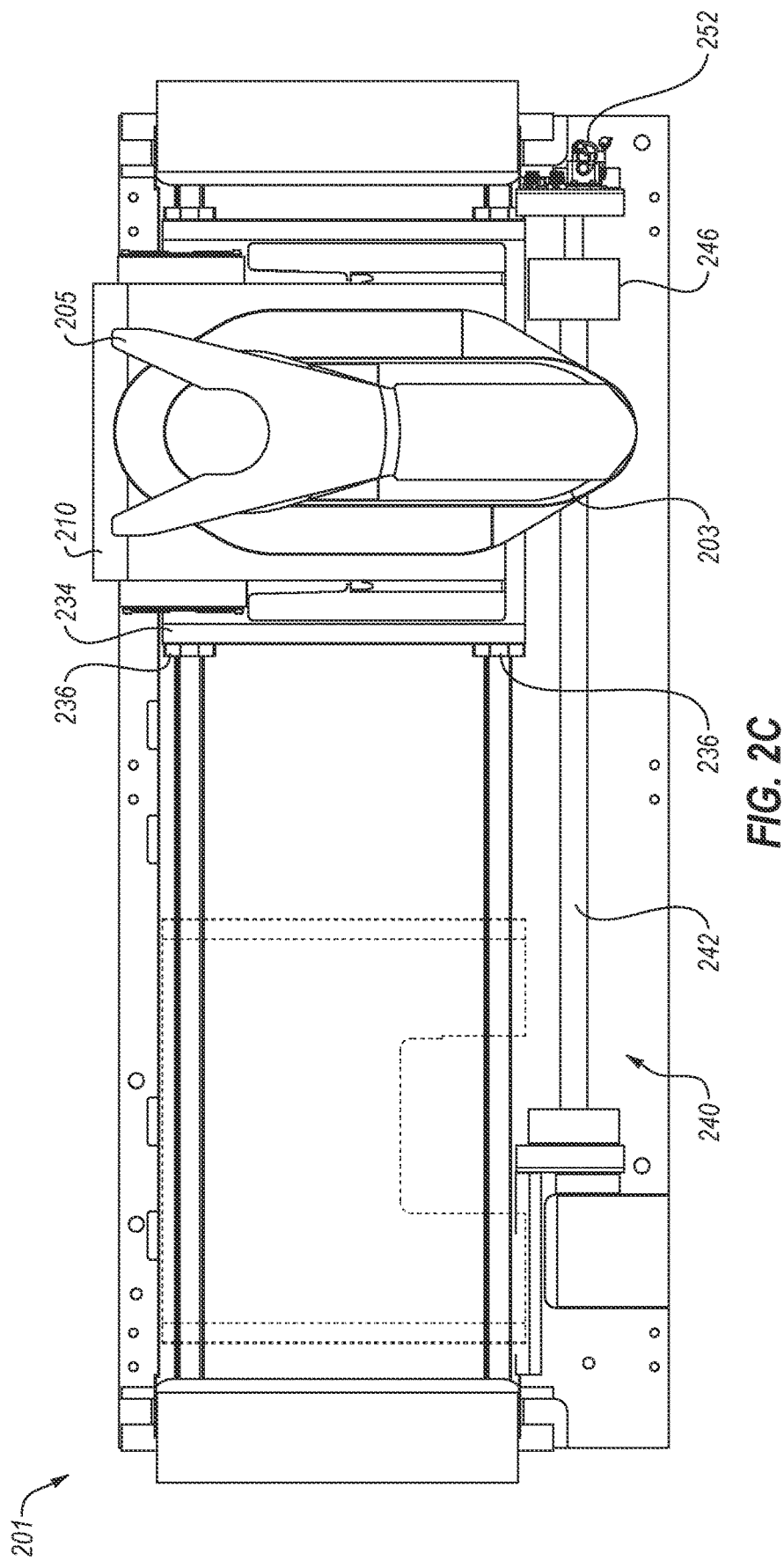
FIG. 2C is top view of the FI robot assembly of FIG. 2A according to an embodiment.
Figure 2D:
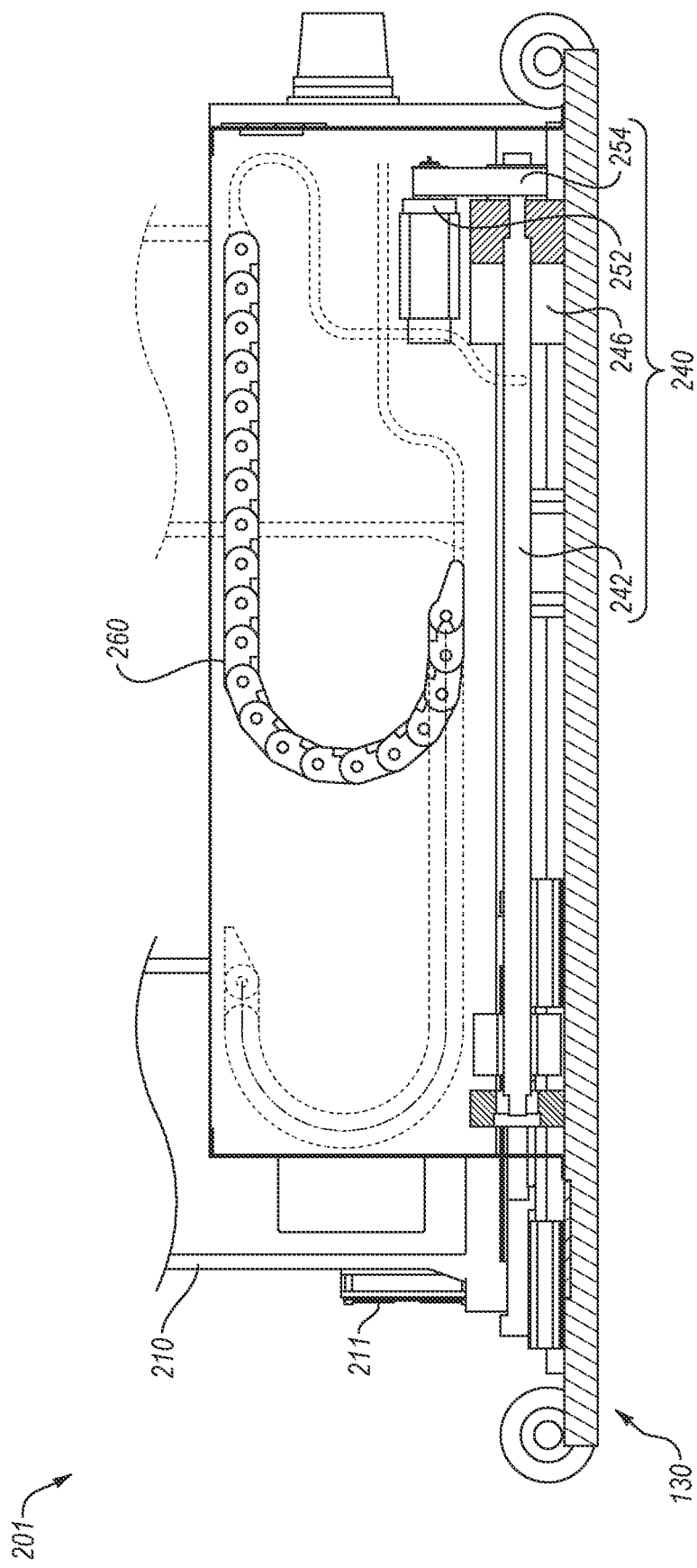
FIG. 2D is a side, cross-section view of the track and driving box of the FI robot assembly according to an embodiment.
Figure 2E:
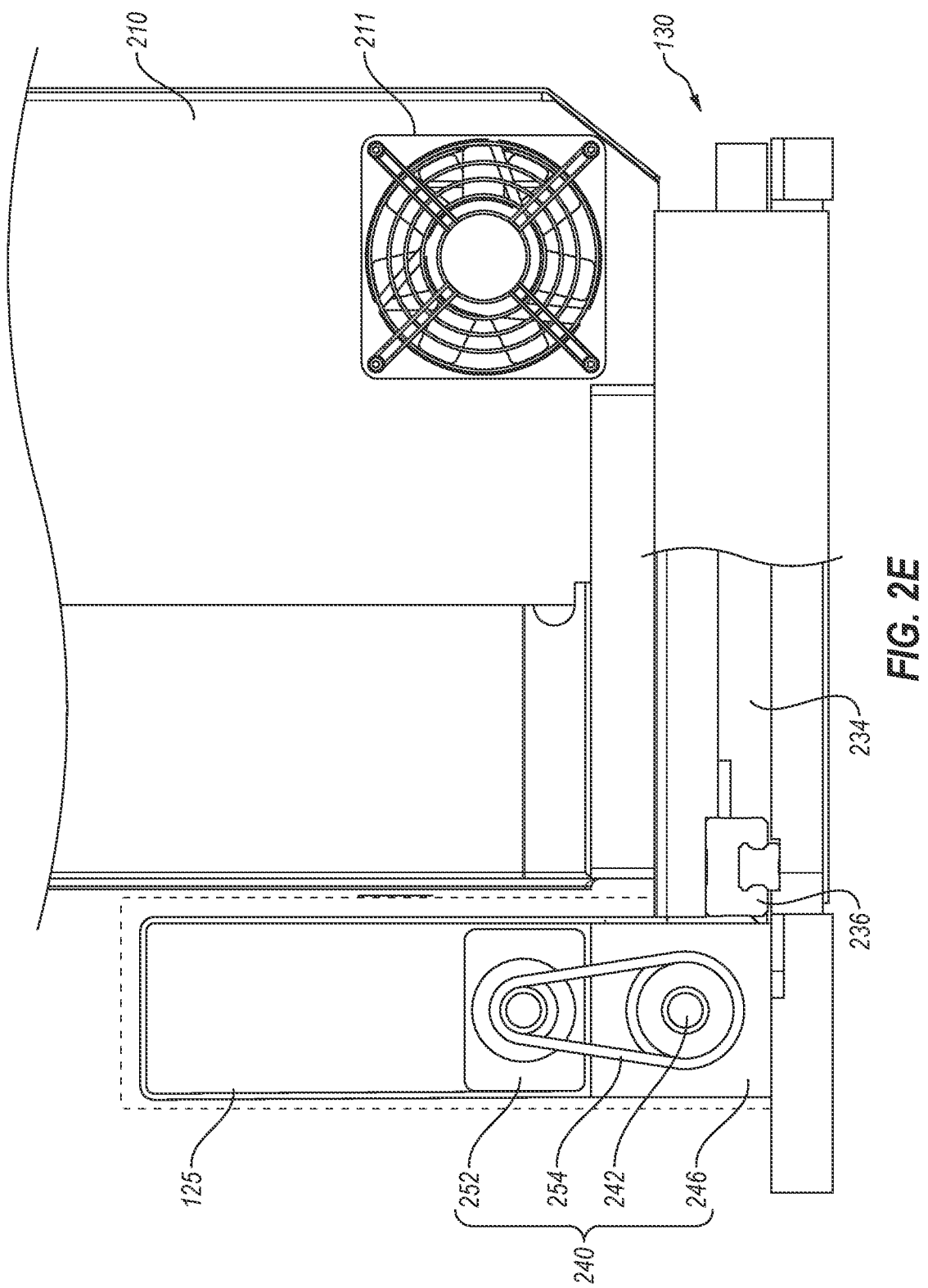
FIG. 2E is an end view of the FI robot assembly of FIG. 2A according to an embodiment.

With additional reference to FIGS. 2B-2E, FIG. 2B is a perspective view of the track 130 and driving box 125 of the FI robot assembly 201 of FIG. 2A according to an embodiment. FIG. 2C is top view of the FI robot assembly 201 of FIG. 2A according to an embodiment. FIG. 2D is a side, cross-section view of the track 130 and the driving box 125 of the FI robot assembly 201 according to an embodiment. FIG. 2E is an end view of the FI robot assembly of FIG. 2A according to an embodiment.

As discussed, the FI robot 120 can move horizontally along the track 130, e.g., within a pair of linear guide rails 232. The track 130 can be attached to a bottom of the FI 100 (such as on a frame piece or directly to a floor of the FI 100) with a slide table 234. The slide table 234 can include, or be attached to, multiple sliders 236 that are adapted to be attached to and slide along the pair of linear guide rails 232. Thus, the multiple sliders 236 can each include a bearing or set of bearings (not illustrated) to facilitate the sliding.

In at least some embodiments, the driving box 125 of the track 130 can further include a ball screw assembly 240 (FIGS. 2C-2D) that provides controllable mechanical actuation to move the FI robot 120 along the pair of linear guide rails 232. The ball screw assembly 240, for example, can include a ball screw shaft 242 coupled to a motor 252 via a timing belt 254 (or other pulley). The ball screw assembly 240 can further include a nut 246 operatively coupled between the ball screw shaft 242 and the FI robot 120. In these embodiments, the ball screw assembly 240 is to move the FI robot 120 horizontally along the track 130, e.g., via the set of linear guide rails 232. The driving box 125 can further include a linked cable 260 (FIG. 2D) that facilitates moving electrical cables along with the motor 250 and the nut 246 as the latter are actuated (e.g., by the controller 150) to move the FI robot 120. As mentioned, these moving parts contribute to levels of contaminants generated by the FI robot 120 from within the FI 100.

In at least some embodiments, and with additional reference to FIG. 2A, the track plenum 202 is added as an opened-topped box to isolate, pull off, and filter out particulate or other contaminants. The track plenum 202 can fit tightly around the track 130 so as to maximize an ability of the track plenum 202 to contain and control of such particulate and other containments. In various embodiments, the controller 150 can measure (and monitor) the pressure of the track plenum 202 surrounding the FI robot 120, e.g., using a pressure sensor 216 attached to an inside of the track plenum 202, which can include being located within the driving box 125. If the track plenum 202 lacks sufficient pressure, e.g., the controller 150 can detect, using the pressure sensor 216, that the pressure is below or does not meet a threshold pressure. In response to detecting such a pressure, the controller 150 can deactivate the robot 120 and the set of load ports 110. Further, or alternatively, the controller 150 can alert an operator of an error and/or prevent operation of the FI 100, in order to prevent operation without the anti-contamination functionality of the track plenum 202.

In some embodiments, the gas recirculation system is configured to include the one or more gas lines 212, each containing a set of gas injectors 213, to generate a gas curtain around the FI robot 120 while the FI robot 120 is moving along the track 130. The one or more gas lines 212 are illustrated at a particular height by way of example, but can be located higher or lower relative to robot 120, so long as the arm assembly 203 can still freely move. In various embodiments, movement of the FI robot 120 itself disrupts the gas flow and can stir up additional particles or contaminants within the mini-environment of the FI 100. The gas recirculation system can further be augmented with fans, gas thrusters, gas intake valves, or other such gas injectors within the tack plenum 202 that change the gas curtain around the FI robot 120 depending on a position and/or speed of the FI robot 120 (or a combination of position, speed, and direction of travel of the robot). For example, the controller 150 can receive feedback or otherwise detect a combination of position, speed, and/or direction of travel of the FI robot 120. The controller 150 can then actuate, according to a predetermined algorithm, the set of gas injectors 213 to modify the gas curtain generated by the FI robot 120 during motion in a way to counteract disturbance (or release) of particles by the motion of the FI robot 120, e.g., that minimizes gas and particulate disruption due to the horizontal movements of the FI robot 120.

In at least some embodiments, and with continued reference to FIG. 2A, the FI robot assembly 101 further includes a duct 204, which can be attached between the track plenum and the set of return ducts 114 (FIGS. 1A-1C). There can be a duct 204 attached generally at a horizontal and/or vertical position to match up with at least one return duct of the set of return ducts 114. Each duct 204 can include a filter 206, which can also include a fan in some embodiments, to filter out contaminants that are created locally within the track plenum 202.

In various embodiments, the FI 100 includes an ionizer positioned near or adjacent to the track 130 that creates positive and negative ions, which can each discharge a charged particle, taking away the ability of charged particles to adhere to a surface such as to the substrates. The ionizer can also optionally be attached to the track 130 or located next to (or integrated within) the one or more gas lines 212. In some embodiments, the ionizers are positioned between 4-12 inches above the track 130. While ionizers are usually used at the substrate transfer level, inclusion of an ionizer on or near the track 130 can help deactivate any particles that might not get filtered out, making them inert.

FIG. 3 is a side view of the factory interface 100 mated with a FOUP 301 at a load port 110, illustrating general gas flow according to an embodiment. In various embodiments, the factory interface 100 includes the gas recirculation system discussed previously, including the pressurized plenum 118 at the top and the return ducts 114A and 114B of the set of ducts 114 located between the load ports 110 and at the corners along a height of the FI housing, respectively. The large arrows illustrate a general movement of the forced gas within the FI 100, including the return gas path through the set of ducts 114 that carry the forced gas back up to the pressurized plenum 118. Not all possible return path flows are illustrated, but are exemplary of return gas paths from a side view. In some embodiments, the gas recirculation system also includes a heater, e.g., within the plenum 118 to further dry out the gas and quicken filtration of particles and chemicals. The heater can enable reducing the humidity within the mini-environment of the FI 100 after a servicing event.

In at least some embodiments, the gas recirculation system further includes a gas filter 312, which includes at least a top filter 312A and a bottom filter 312B, positioned between the plenum 118 and the interior of the FI 100 where the robot 120 moves and operates. The gas filter 312 can filter out various contaminants from the recycled gas, e.g., the ambient air, CDA, nitrogen, or other inert gas being forced from a gas source within the pressurized plenum 118 such as a fan or gas source unit. For example, the top filter 312A can be a chemical filter for filtering out AMCs and VOCs. Further, the bottom filter 312B can be a particle filter that filters out physical particles, e.g., that are not chemical or organic in nature. In some embodiments, the top filter 312A and the bottom filter 312B are selectively retractable so that only one or both can be used at a time.

In some embodiments, the controller 150 can selectively disable the return ducts and open vents in the plenum 118 and the floor in order to operate in an ambient mode instead of a recirculation mode. Functioning in an ambient mode may be preferred for some substrate processing, and therefore, the gas recirculation system can be adapted to be selectively switched between the recirculation mode and the ambient mode.

Figure 4:
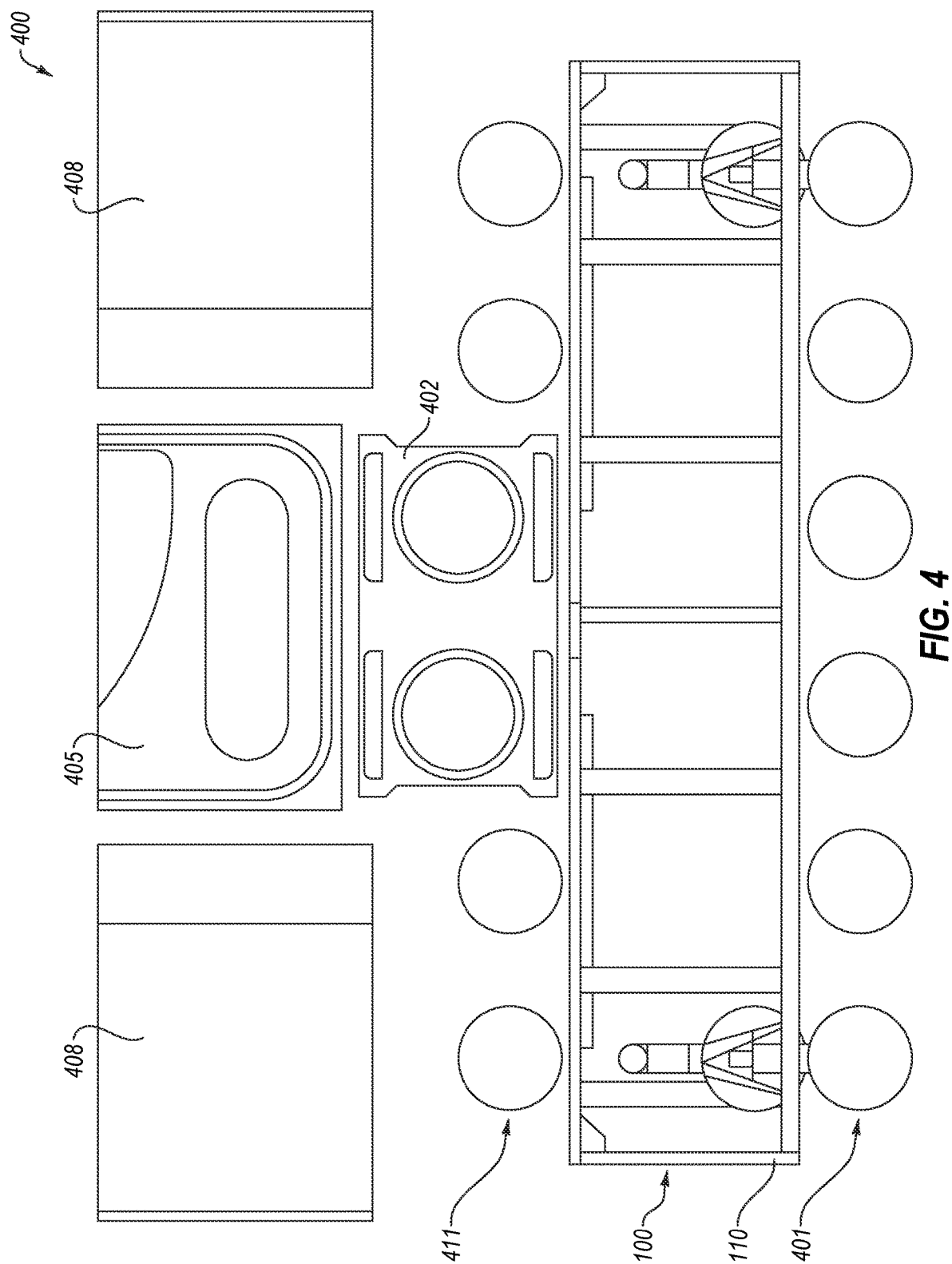
FIG. 4 is a top view of an electronics manufacturing system including the factory interface attached to a load lock according to an embodiment.

FIG. 4 is a top view of an electronics manufacturing system 400 including the factory interface 100 attached to a load lock 402 according to an embodiment. The electronics manufacturing system 400 can further include a transfer chamber 405 attached to the load lock 402 and one or more processing chambers 408 attached to facets of the transfer chamber 405. The factory interface 100 includes the set of load ports 110, e.g., load port chambers, which include at least six load ports as previously discussed. In some embodiments, at least one of the set of load ports 110 is adapted to be a side storage pod (SSP) integrated within the FI 100 and adapted to store substrates. For example, in one embodiment, each of the outermost load ports 110 can be adapted to instead be SSPs.

The six substrates 401 illustrated at the front of the FI 100 can be understood to represent six potential FOUPs that can supply and receive substrates as the substrates are processed. A set of additional substrates 411 can be representative of substrate storage locations, e.g., where processed substrates can be outgassed (e.g., using chlorine or bromine or the like), cooled, and wait for transfer back through the load lock 402 into the FI 100. All wafers in a particular storage station can be returned to a particular FOUP. The FI robot is not illustrated in FIG. 4 for purposes of simplicity of explanation.

Figure 5:
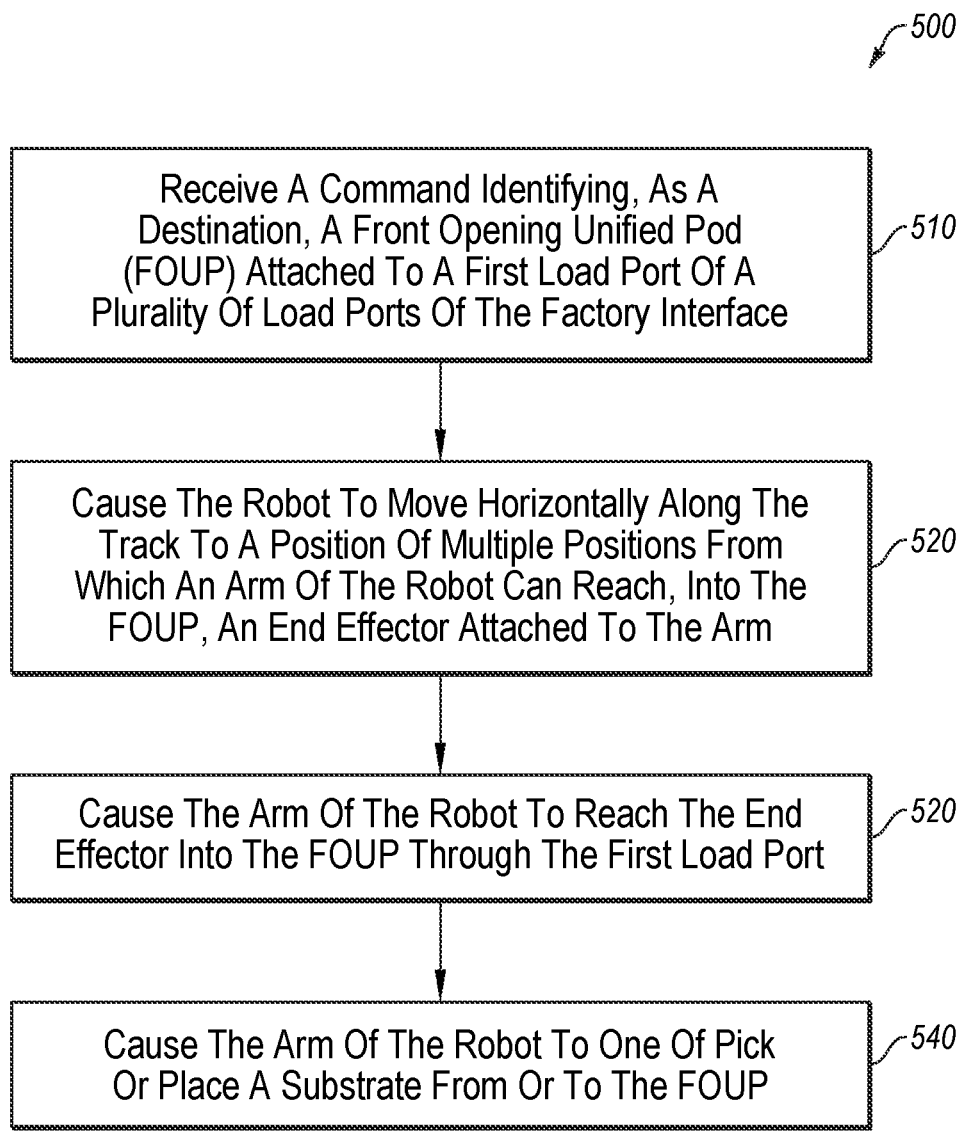
FIG. 5 is a flow diagram of a method for operating a robot-track assembly according to various embodiments.

FIG. 5 is a flow diagram of a method 500 for operating a robot-track assembly according to various embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the controller 150 (or similar processing device) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a command identifying, as a destination, a front opening unified pod (FOUP) attached to a first load port of a plurality of load ports of the factory interface.

At operation 520, the processing logic causes the robot to move horizontally along the track to a position of multiple positions from which an arm of the robot is to reach, into the FOUP, an end effector that is attached to the arm. In some embodiments, causing the robot to move horizontally along the track includes controlling a ball screw assembly that is operatively coupled between a slide table, which is attached to the robot, and a motor that is controlled according to a horizontal destination of the robot. In at least some embodiments, the track extends along a subset of the plurality of load ports that excludes at least the outermost load ports of the plurality of load ports. In at least some embodiments, therefore, causing the robot to move horizontally includes causing the robot to move to an outermost load port of the subset of the plurality of load ports before causing the arm of the robot to reach the end effector into one of the outermost load ports of the plurality of load ports.

At operation 530, the processing logic causes the arm of the robot to reach the end effector into the FOUP through the first load port.

At operation 540, the processing logic causes the arm of the robot to one of pick or place a substrate from or to the FOUP.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A factory interface comprising:
   a housing;
   a front surface of the housing comprising a plurality of load ports, wherein the plurality of load ports comprise at least six load ports;
   a robot having an arm and an end effector; and
   a track attached to a floor within the housing, wherein the robot is adapted to move horizontally along the track to multiple positions from which the arm can reach the end effector of the robot into a front opening unified pod attached to any of the plurality of load ports, wherein the multiple positions exclude at least the outermost two load ports of the at least six load ports.

2. The factory interface of claim 1, wherein the track extends along a subset of the plurality of load ports that excludes at least the outermost load ports of the plurality of load ports.

3. The factory interface of claim 1, wherein the front surface comprises a pair of posts that are removable, wherein the robot and track are removable through a space in the housing opened up by removal of the pair of posts.

4. The factory interface of claim 1, further comprising:
   a gas recirculation system;
   a track plenum surrounding the track; and
   a duct attached between the track plenum and a return duct of a gas recirculation system.

5. The factory interface of claim 4, further comprising at least one of a fan or a filter integrated within the duct to filter out contaminants that are created locally to the track plenum.

6. The factory interface of claim 4, further comprising:
   a pressure sensor to measure a pressure of an inside of the track plenum; and
   a controller coupled with the robot, the plurality of load ports, and the pressure sensor, wherein the controller is to:
      detect, using the pressure sensor, that the pressure within the track plenum does not meet a threshold pressure; and
      deactivate the robot and the plurality of load ports in response to detecting the pressure.

7. The factory interface of claim 1, further comprising:
   a set of gas injectors located adjacent to the robot; and
   a controller coupled with the robot and the set of gas injectors, wherein the controller is to:
      detect a combination of a position, speed, and direction of travel of the robot along the track; and actuate the set of gas injectors to modify a gas curtain generated by the robot during motion in a way to counteract disturbance of particles by the motion of the robot.

8. The factory interface of claim 1, further comprising a gas recirculation system comprising:
a pressurized plenum positioned at a top of the housing including a source of forced gas that forces gas downward through the housing, wherein the forced gas is clean dry air, an inert gas, or a combination thereof; and
a set of return ducts located between the plurality of load ports and at corners along a height of the housing, the set of return ducts to carry the forced gas back up to the pressurized plenum.

9. The factory interface of claim 8, further comprising:
a first door attached to a side of the housing to selectively cover the pressurized plenum; and
a second door attached to the side of the housing to selectively cover a space occupied by the robot and the track.

10. An assembly comprising:
a robot having an arm and an end effector;
a track attachable to a floor within a factory interface, wherein the robot is slidably attachable to the track to move horizontally along the track to multiple positions from which the arm can reach the end effector of the robot into a front opening unified pod attached to any of a plurality of at least six load ports of the factory interface, wherein the multiple positions exclude at least the outermost two load ports of the at least six load ports; and
a ball screw assembly comprising:
a ball screw shaft coupled to a motor via a timing belt; and
a nut operatively coupled between the ball screw shaft and the robot; and
wherein the ball screw assembly is to move the robot horizontally along the track.

11. The assembly of claim 10, further comprising:
a pair of linear guide rails attached to a floor of the track; and
a slide table comprising multiple sliders that are adapted to be attached to and slide along the pair of linear guide rails, wherein the nut is attached to the slide table.

12. The assembly of claim 10, further comprising:
the motor; and
a driving box containing a linked cable that causes electrical cables attached to the motor to move along with the motor and the nut.

13. The assembly of claim 10, wherein the robot further comprises a chemical and particle filter at an outlet of a fan of the robot.

14. The assembly of claim 10, further comprising:
a track plenum to surround and pressurize the track; and
a duct attachable between the track plenum and a return duct of a gas recirculation system.

15. The assembly of claim 14, further comprising at least one of a fan or a filter integrated within the duct to filter out contaminants that are created locally to the track plenum.

16. The assembly of claim 14, further comprising:
a pressure sensor to measure a pressure of an inside of the track plenum; and
a controller to be coupled with the robot, the plurality of at least six load ports, and the pressure sensor, wherein the controller is to:
detect, using the pressure sensor, that the pressure within the track plenum does not meet a threshold pressure; and
deactivate the robot and the plurality of at least six load ports in response to detecting the pressure.

17. The assembly of claim 10, further comprising:
a set of gas injectors to be located adjacent to the robot; and
a controller to be coupled with the robot and the set of gas injectors, wherein the controller is to:
detect a combination of a position, speed, and direction of travel of the robot along the track; and
actuate the set of gas injectors to modify a gas curtain generated by the robot during motion in a way to counteract disturbance of particles by the motion of the robot.

18. A method of operating an assembly comprising a robot that is slidably attached to a track, the track being attached to a floor of a factory interface, wherein the method comprises:
receiving a command identifying, as a destination, a front opening unified pod (FOUP) attached to a first load port of a plurality of at least six load ports of the factory interface;
causing the robot to move horizontally along the track to a position of multiple positions from which an arm of the robot is to reach, into the FOUP, an end effector that is attached to the arm, wherein the track extends along a subset of the plurality of at least six load ports that excludes at least the outermost load ports of the plurality of at least six load ports;
causing the arm of the robot to reach the end effector into the FOUP through the first load port; and
causing the arm of the robot to one of pick or place a substrate from or to the FOUP.

19. The method of claim 18, wherein causing the robot to move horizontally along the track comprises controlling a ball screw assembly that is operatively coupled between a slide table, which is attached to the robot, and a motor that is controlled according to a horizontal destination of the robot.

20. The method of claim 18, wherein causing the robot to move horizontally comprises causing the robot to move to an outermost load port of the subset of the plurality of at least six load ports before causing the arm of the robot to reach the end effector into one of the outermost load ports of the plurality of at least six load ports.

* * * * *